(12) United States Patent
van den Berg et al.

(10) Patent No.: US 7,936,192 B2
(45) Date of Patent: May 3, 2011

(54) ALIAS-LOCKED LOOP FREQUENCY SYNTHESIZER USING A REGENERATIVE SAMPLING LATCH

(76) Inventors: Leendert Jan van den Berg, Edmonton (CA); Duncan George Elliott, Edmonton (CA)

(*) Notice: Subject to any disclaimer, the term of this patent is extended or adjusted under 35 U.S.C. 154(b) by 0 days.

(21) Appl. No.: 12/467,254

(22) Filed: May 15, 2009

(65) Prior Publication Data

US 2009/0284286 A1 Nov. 19, 2009

Related U.S. Application Data

(60) Provisional application No. 61/071,767, filed on May 16, 2008.

(51) Int. Cl.
*H03L 7/06* (2006.01)
(52) U.S. Cl. ........................ 327/156; 327/147
(58) Field of Classification Search ................ 327/149, 327/158, 147, 156
See application file for complete search history.

(56) References Cited

U.S. PATENT DOCUMENTS

| | | | |
|---|---|---|---|
| 6,366,174 B1 * | 4/2002 | Berry et al. | 331/78 |
| 6,463,112 B1 * | 10/2002 | Hafez et al. | 375/376 |
| 7,062,733 B1 * | 6/2006 | Poskatcheev et al. | 716/6 |
| 7,068,202 B2 * | 6/2006 | Waltari | 341/155 |
| 7,088,275 B2 * | 8/2006 | Waltari | 341/155 |
| 7,683,679 B2 * | 3/2010 | Cheung et al. | 327/115 |
| 7,724,096 B2 * | 5/2010 | Rofougaran | 331/51 |
| 7,746,134 B1 * | 6/2010 | Lu et al. | 327/158 |
| 7,755,403 B2 * | 7/2010 | Yun et al. | 327/158 |
| 7,755,405 B2 * | 7/2010 | Yun et al. | 327/158 |
| 7,783,251 B2 * | 8/2010 | Rofougaran et al. | 455/20 |
| 2006/0114044 A1 * | 6/2006 | Mintchev et al. | 327/261 |
| 2007/0276208 A1 * | 11/2007 | Connelly et al. | 600/309 |
| 2009/0251225 A1 * | 10/2009 | Chen et al. | 331/1 A |
| 2009/0284286 A1 * | 11/2009 | van den Berg et al. | 327/107 |
| 2010/0040175 A1 * | 2/2010 | Muraguchi et al. | 375/326 |
| 2010/0201415 A1 * | 8/2010 | Ma | 327/158 |

* cited by examiner

*Primary Examiner* — Lincoln Donovan
*Assistant Examiner* — Adam D Houston

(57) ABSTRACT

A frequency synthesis phase-locked loop architecture using a regenerative sampling latch is described. The frequency divider typically employed in the feedback path of a frequency synthesis phase-locked loop is replaced by a regenerative sampling latch with a binary output. The regenerative sampling latch subsamples the frequency synthesizer output to produce a low-frequency aliased signal that can be processed further or directly used to lock the phase-locked loop. This architecture is referred to as an alias-locked loop. The relaxed constraints on the regenerative sampling latch make it possible to create high-speed frequency synthesizer phase-locked loops without the suffering the limitations imposed by traditional dividers connected directly to the oscillator output.

16 Claims, 8 Drawing Sheets

US 7,936,192 B2

ALIAS-LOCKED LOOP FREQUENCY SYNTHESIZER USING A REGENERATIVE SAMPLING LATCH

U.S. PATENTS CITED

Amr N. Hafez and Mohamed I. Elmasry, Phase Locked-Loop Using Sub-Sampling, 2002, U.S. Pat. No. 6,463,112.

Amr N. Hafez and Mohamed I. Elmasry, Phase Locked-Loop Using Sub-Sampling, 2003, U.S. Pat. No. 6,614,866.

George E. Von Dolteren, Jr., Subsampling Digitizer-Based Frequency Synthesizer, 2003, U.S. Pat. No. 6,603,362

STATEMENT REGARDING FEDERALLY SPONSORED RESEARCH OR DEVELOPMENT

Not applicable

REFERENCE TO SEQUENCE LISTING, A TABLE, OR A COMPUTER PROGRAM LISTING COMPACT DISK APPENDIX

Not applicable

FIELD OF THE INVENTION

This invention is in the field of phase locked-loop (PLL) based frequency synthesizers. More particularly, the present invention describes a PLL frequency synthesizer employing a regenerative sampling latch circuit in the feedback loop.

BACKGROUND OF THE INVENTION

Frequency synthesizers are circuits that take one or more input signals with known frequencies and produce one or more output signals at other frequencies. In most cases, frequency synthesizers accept one or more low frequency precise reference signals as inputs and generate a range of higher frequency signals that are mathematically related to the frequencies of the reference signals. Frequency synthesizers are found in virtually all modern communication systems, including wireless data networks, cellular phones, radio and televisions receivers, and fiber optic transceivers. Frequency synthesizers are not just found in communication systems, however, as they are also used as clock sources in other applications such as digital logic and radar systems.

One method of building frequency synthesizers uses phase-locked loops (PLLs). Common elements in most frequency synthesis PLLs include a tunable local oscillator circuit, phase detector, loop filter and frequency frequency reduction circuit. These elements are usually connected in a loop. The oscillator circuit is connected to the frequency synthesizer output and is, through a feedback mechanism, tuned to produce an output signal of the desired output frequency. The tuning is achieved by coupling the oscillator output signal through a frequency reduction circuit on the feedback path between the oscillator and the phase detector. The phase detector compares the frequency reduced oscillator signal and a precise reference frequency signal and generates an oscillator tuning signal that is coupled through the loop filter to the oscillator. In most frequency synthesizers, the feedback path frequency reduction is accomplished using a frequency divider.

A method using subsampling for frequency reduction in the feedback path was disclosed by Amr. N Hafez and Mohamed I. Elmasry in 2002 and 2003 in U.S. Pat. Nos. 6,463,112 and 6,614,866. The same authors provided further descriptions in *A Novel Low Power Low Phase-Noise PLL Architecture for Wireless Transceivers*, published in the Proceedings of the $9^{th}$ Great Lakes Symposium on VLSI, pages 306-309 in March of 1999 and in *A Low Power Monolithic Subsampled Phase-Locked Loop Architecture for Wireless Transceivers*, published in the Proceedings of the International Conference on Circuits and Systems (ISCAS), pages 549-552, volume 2, in July of 1999. The benefits of the subsampling method disclosed in these patents and publications are claimed to be reduced power consumption and improved phase-noise characteristics when compared to frequency divider based techniques. The subsampling design in said patent uses analog sample-and-hold circuits that perform a mixing operation between the oscillator signal and a sample signal of a precise frequency. With a sample signal that is below the Nyquist frequency of the oscillator signal, the analog sample-and-hold subsampling circuit output contains a low frequency alias of the oscillator signal which can be used by the phase detector in a manner similar to a frequency divided signal. The mixing operation by the analog sample-and-hold subsampling circuit, however, generates numerous low-frequency harmonic signals in addition to the desired low-frequency alias signal to be compared by the phase detector. These harmonic signals must therefore be attenuated through a secondary low-pass filtering method before the signal can be compared with the reference signal in the phase detector.

In a subsampling digitizer-based frequency synthesizer invention disclosed by George E. Von Dolteren in U.S. Pat. No. 6,603,362 the analog sample-and-hold circuit is replaced by an analog-to-digital converter (ADC). The ADC produces a digital output corresponding to the oscillator signal level, allowing digital processing of the subsampled signal.

In previous architectures relying on frequency reduction, the feedback path is the critical component in the PLL that limits the maximum frequency that can be generated by the frequency synthesizer. Complementary metal-oxide-semiconductor (CMOS) oscillators in the form of voltage-controlled oscillators (VCOs) have been demonstrated operating at frequencies well in excess of the unity-current gain frequency of a given CMOS process technology. An instance of such a VCO is described in the paper *A 410 GHz CMOS push-push oscillator with an on chip patch antenna*, by E. Seok et al. and was published in the Proceedings of the 2008 International Solid-State Circuits Conference, pages 472-474 on February 2008. Although using PLL-based frequency synthesizer for synthesis of signals at frequencies near or exceeding the unity-current gain frequency of a given process is desirable, development of PLL-based frequency synthesizers capable of achieving frequencies near or exceeding unity-current gain frequencies has been lagging. Frequency reduction in the feedback path using frequency divider or analog sample-and-hold subsampling methods have not been shown to be capable of operating at the required high frequencies. The digitizer approach to subsampling is even less likely to operate at the desired frequencies, as even the fastest documented ADCs operate at only a small fraction of the unity-current gain frequency of a given process technology.

BRIEF SUMMARY OF THE INVENTION

The present invention is a PLL-based frequency synthesizer that includes a phase detector, a loop filter, a tunable oscillator, and a regenerative sampling latch. The regenerative sampling latch is placed in the feedback loop and operates as a frequency reduction circuit by sampling the oscillator signal. The regenerative sampling latch is clocked by a separate sampling signal at a frequency lower than the oscillator frequency. The regenerative sampling latch uses internal regenerative feedback to produce a binary signal at its output for each sample instant, as controlled by the sampling signal. This regenerative sampling latch acts like a decision circuit that evaluates the oscillator signal to a logic high or logic low value for each sampling instant. The binary signal at the output corresponds to a decision on the input signal level relative to the input switching threshold of the regenerative sampling latch. The frequency of the regenerative sampling latch output signal averages to an alias frequency that is determined by the sampling signal frequency and oscillator frequency.

In some embodiments, the regenerative sampling latch further comprises a separate input that allows for adjustment of the input switching threshold.

In some embodiments, the regenerative sampling latch is coupled to a duty-cycle measurement circuit that evaluates the duty cycle of the regenerative sampling latch output signal.

In some embodiments, the regenerative sampling latch comprises a separate input that allows for the adjustment of the switching threshold and where said input switching threshold adjustment controls are coupled to a duty-cycle measurement circuit at the output of the regenerative sampling latch.

In some embodiments, a secondary regenerative sampling latch circuit is operated in parallel, but not sampled at the same frequency as the first regenerative sampling latch. This allows for a reduction in the number of possible frequencies at which the oscillator is operating at when the PLL is locked.

In some embodiments, the phase detector in the PLL can be decoupled from the loop filter, thereby allowing the regenerative sampling latch to be operated at other sampling frequencies and providing the opportunity to uniquely determine the operating frequency of the oscillator through monitoring of the regenerative sampling latch circuit output signal in response to a plurality of sample signal frequencies.

The present invention does not require the high frequency operation of circuit elements like those in classical frequency divider PLL-based frequency synthesizers. Also, unlike the analog sample-and-hold subsampling method for PLLs, a regenerative sampling latch does not produce undesirable harmonics at its output port and does not require a secondary low-pass filtering method. Additionally, due to low frequency operation of internal circuit components, a regenerative sampling latch allows for operation on input signals near or exceeding the unity-current gain frequency for a given process technology.

The following drawings and description provide further details about the specific nature of the invention.

DETAILED DESCRIPTION OF THE INVENTION

Figure 1:
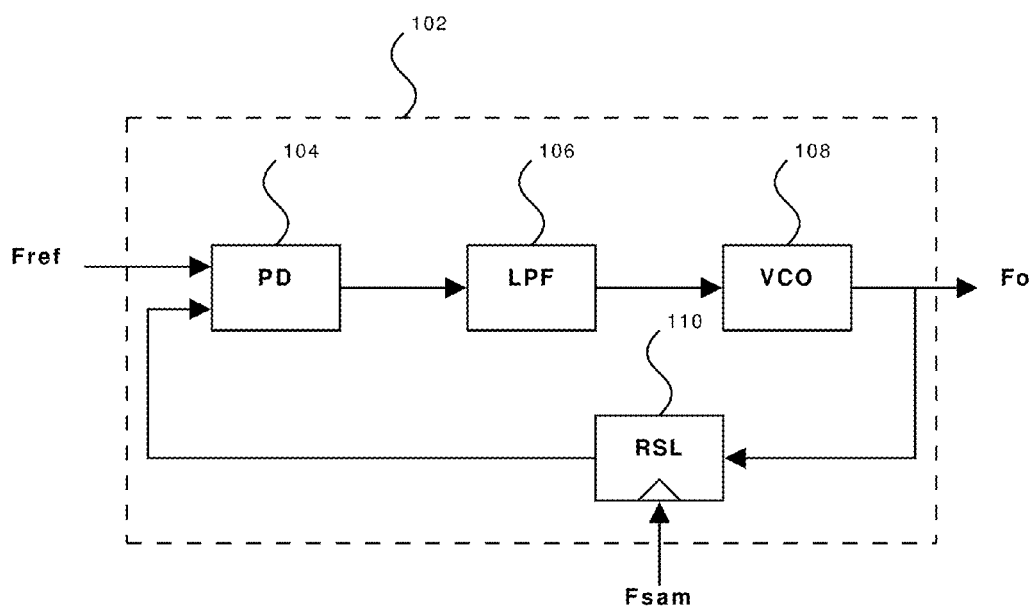
FIG. 1 is a block diagram of a frequency synthesizer using a regenerative sampling latch in the phase-locked loop feedback path in accordance with the present invention.

Before a detailed description is given of frequency synthesis using a regenerative sampling latch in the feedback path of the phase-locked loop (PLL), it is to be understood that the present invention fits in what is effectively a prescribed arrangement of conventional analog and digital circuits and components, and not the details of such components. As such, the configuration of such circuits and components, and the manner in which they may be interfaced with other systems, circuits or components have, for the most part, been illustrated in block diagram format, showing only those details that are pertinent for the present invention, so as not to obscure the disclosure with details which will be readily apparent to those skilled in the art having the benefit of the description herein. Thus, the block diagram illustrations are primarily intended to show the major components of the frequency synthesizer in a conventional functional grouping, whereby the present invention may be more readily understood.

This invention disclosed herein describes a method to build frequency synthesis circuits for high-frequency applications without frequency division in the feedback path of the PLL circuit. This invention eliminates problematic harmonic frequencies that arise when using analog sample-and-hold subsampling methods and furthermore, is not limited by low-speed analog-to-digital converters (ADC) in digitizer based subsampling methods. Rather than using frequency dividers or prescalers to reduce the frequency of the oscillator signal, the oscillator output is sampled directly by a high-speed regenerative sampling latch or regenerative sampling flip-flop. The sampling latch is clocked by a sample signal operating at a frequency much lower than the oscillator frequency. Because the regenerative sampling latch is operated much below the Nyquist frequency of the oscillator signal, the sampler output will be a subsampled version of the oscillator signal. Subsampling will generate an aliased copy of the oscillator signal, which is used instead of a frequency divided signal. This low-frequency aliased signal is then processed normally by a phase detector and compared with a reference clock to control the oscillator via a loop filter. Since the PLL uses an aliased signal to control the oscillator, this system can also be referred to as an alias-locked loop. The maximum frequency that the PLL can operate at is in part dependent on the regenerative sampling latch used in the feedback path. Because the sampling latch does not actually operate at the oscillator frequency, very high oscillator frequencies are no longer problematic in the PLL design. Because the sampling latch is operated at a much lower frequency than typical frequency dividers, power consumption is also reduced. The maximum attainable frequency will depend on the implementation method chosen for the sampling latch. Several favorable trade-offs relax the constraints usually placed on latch circuits, and allow the sampling latch to be optimized for functionality at a maximum input frequency.

General Operation

In the architecture described in this invention, the frequency divider and/or prescaler unit normally found in feedback path of a frequency synthesizer PLL are replaced by a regenerative sampling latch, and one embodiment of a regenerative sampling latch frequency synthesizer PLL is diagrammatically depicted in FIG. 1. The embodiment in FIG. 1 shows that the frequency synthesizer 102 is indeed similar to a typical frequency synthesizer PLL, with a phase detector (PD) 104 that compares the frequency reference signal Fref and feedback signal from the regenerative sampling latch (RSL) 110. The output of the phase detector 104 is coupled to a loop filter in the form of a low pass filter (LPF) 106. The LPF 106 output controls the oscillator 108 frequency. The oscillator 108 output signal is also the frequency synthesizer 102 output signal Fo. This oscillator output is also coupled to the RSL 110 feedback element so that a reduced frequency feedback signal is generated for the phase detector 104. The RSL 110 is clocked by a sample signal Fsam, typically at a frequency well below the oscillator 108 frequency, resulting in subsampling as further described elsewhere in this invention.

Figure 2:
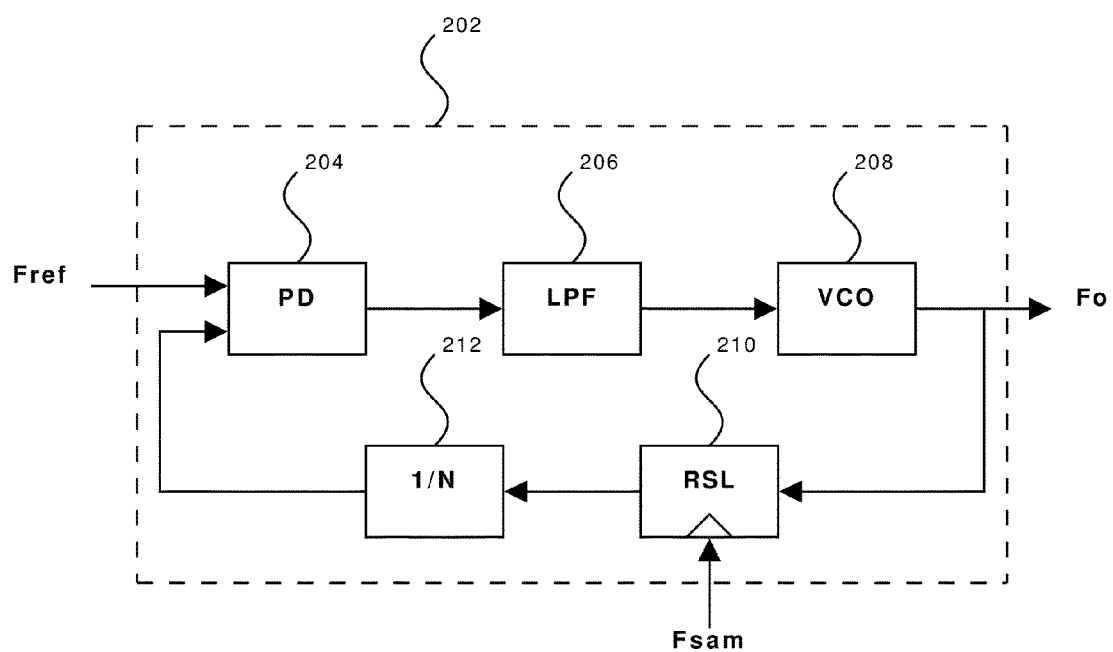
FIG. 2 shows modification of the frequency synthesizer shown in FIG. 1 to incorporate a frequency divider in cascade with the regenerative sampling latch to allow for an additional reduction in frequency. In the case where the frequency divider is programmable, the frequency reduction factor in the feedback path is configurable, allowing a plurality of frequencies to be synthesized through configuration of the frequency divider.

The embodiment of FIG. 1 can be modified by the addition of a frequency divider in the feedback path. Such an embodiment is depicted in FIG. 2 and shows the frequency synthesizer 202, with a phase detector (PD) 204 that compares the frequency reference signal Fref and feedback signal from regenerative sampling latch (RSL) 210 coupled through a frequency divider 212. The frequency divider 212 can further reduce the frequency of the signal produced by the RSL 210. Additional, if the frequency divider 212 is programmable, the frequency synthesizer 202 can produce a variety of output frequencies Fo without the requirement that the frequencies of the reference signal Fref or sample signal Fsam be alterable. The output of the phase detector 204 is coupled to a loop filter in the form of a low pass filter (LPF) 206. The LPF 206 output controls the oscillator 208 frequency. The oscillator 208 output signal is also the frequency synthesizer 202 output signal Fo. This oscillator output is also coupled to the RSL 210 feedback element so that a reduced frequency feedback signal is generated for the phase detector 204. The RSL 210 is clocked by a sample signal Fsam.

The design of the loop filter for a PLL-based frequency synthesizer using a regenerative sampling latch requires that the loop filter parameters be reconsidered when compared to a classical PLL based frequency synthesizer. Indeed, the frequency relationship between the feedback signal at the phase detector and the oscillator differs from a normal frequency divided feedback signal found in typical embodiments of frequency divider-based PLL frequency synthesizers.

In previously disclosed inventions related to subsampling in PLLs, the subsampling circuits use either analog sample-and-hold circuits or analog-to-digital converters to perform the subsampling operations. Both approaches require further processing of the subsampled signal before it is suitable for comparison in the phase detector. The invention disclosed herein instead relies on a sampling latch with regenerative internal feedback (also known as positive feedback) that produces a binary output, rather than an analog or multi-level digital representation of the sampled oscillator signal. A static latch, including most conventional digital latches, store a binary value using internal positive feedback or regeneration. Such regenerative sampling latches can take a small signal near the switching threshold on their input, and over time amplify the input signal to a high or low logic level. In the invention disclosed herein, the sampling latch acts like a decision circuit on the sampling latch input signal (i.e. the oscillator output signal) and evaluates the oscillator output to either a logic low or logic high value. Using a regenerative sampling latch in this fashion eliminates problematic low-frequency harmonics. Furthermore, a properly designed sampling latch can operate on fast changing inputs and can therefore be used to develop high-speed frequency synthesis systems.

Subsampling, whether with a sample-and-hold circuit or sampling latch, results in aliasing of the oscillator frequency around the sampling frequency. When using a subsampling circuit on an oscillator signal with a frequency of $f_{osc}$, the output frequency from the aliasing circuit $f_{alias}$ is determined by the sampling frequency $f_{sample}$ and is given by:

$$f_{alias} = f_{osc} - f_{sample} \cdot \text{round}(f_{osc}/f_{sample}) \quad (1)$$

where the round(x) function rounds the argument x to the nearest integer value. The aliasing operation produces an output frequency $f_{alias}$ that ranges between $\pm f_{sample}/2$, although positive and negative frequencies are indistinguishable. An interesting result is that for a subsampling frequency synthesizer system in the locked state, the output frequency of the oscillator cannot be uniquely determined from a single sampling rate and reference frequency at the phase detector. For an oscillator with a tuning range greater than the sampling frequency, there are in fact multiple oscillator frequencies at which the PLL could lock. For the typical PLL system with negative feedback, the oscillator frequency is related to the sampling rate and reference frequency $f_{ref}$ by:

$$f_{osc} = K \cdot f_{osc} + f_{ref} \quad (2)$$

where K is some unknown positive integer, bounded by the frequency range of the oscillator. The oscillator can operate at frequencies where the alias frequency would match the reference clock:

$$f_{osc} = K \cdot f_{osc} - f_{ref} \quad (3)$$

but, in a system with negative feedback, the system would not lock at this frequency. For instance, at such a frequency, an increase in $f_{oscs}$ will decrease $f_{alias}$ and result in feedback that would increase the oscillator frequency even further, and steer the oscillator away from operating at the frequency given by Equation (3). However, if the system is configured with positive feedback, the system would lock at oscillator frequencies given by Equation (3).

Equations (1) through (3) accurately describe the frequency of the signal produced by the analog output of a sample-and-hold sampler. Using a sampling latch with binary outputs digitizes the sampler output and produces a square wave signal with signal edges discretized in time, aligned with the sampling clock. When binary sampling the oscillator, the period of the aliased signal must be a multiple of the sampling period. As a result, the instantaneous frequency of the aliased signal does not necessarily match the frequency given by Equation (1). The long-term average frequency of the aliased signal does, however, match Equation (1), assuming a constant sampling rate and steady oscillator frequency.

For the special case where the period of the aliased signal is a multiple of the sampling period, the instantaneous frequency will not vary. In the general case, the frequency of the aliased signal will alternate proportionally between two frequencies, governed by the sampling period. This proportion will be such that the average frequency produced by subsampling will match Equation (1). It is interesting to note that if traditional s-domain analysis were to be performed, the feedback division factor for an alias-locked loop would approximate to unity. This follows from Equation (1), and makes intuitive sense, since the frequency and phase of the oscillator are not scaled in a sampling operation. This result contrasts with typical frequency dividers, where oscillator phase and frequency are scaled proportionally to the division ratio.

In order to narrow down the possible frequencies at which the oscillator is operating when the PLL is locked, multiple sample frequencies can be applied. The ability to use more than one sample frequency can reduce the number of candidate operating frequencies of the oscillator. For instance, if an oscillator signal is sampled at 1 Hz and the reference signal is 0.2 Hz, the possible oscillator frequencies that could be synthesized, as per Equation (2), are: 1.2 Hz, 2.2 Hz, 3.2 Hz, 4.2 Hz, etc. Now, if the reference frequency is kept the same and the sample frequency is changed to 0.6 Hz, the possible oscillator frequencies are now: 0.8 Hz, 1.4 Hz, 2.0 Hz, 2.6 Hz, 3.2 Hz, etc. Combining the two sampling frequencies, the number of possible oscillator frequencies are now 3.2 Hz, 6.2 Hz, 9.2 Hz, 12.2 Hz, etc. With knowledge of the oscillator tuning range the number of possible oscillator frequencies possible is reduced when two sampling frequencies are applied. The oscillator frequencies $f_{osc}$ at which the PLL locks with two sampling frequencies $f_{sample1}$ and $f_{sample1}$, and a reference frequency $f_{ref}$ is given by:

$$f_{osc} = K \cdot lcm(f_{sample1}, f_{sample2}) + f_{ref} \qquad (4)$$

where K is any positive integer and the function lcm( ) finds the lowest common multiple of its arguments. Choosing two sample frequencies with a large common multiple such that there is only one solution to Equation (4) within the tuning range of the oscillator can help ensure that the oscillator operates at the desired frequency. Of course, more than two sample frequencies can be used as well, and Equation (4) can be extended for more than two sample frequencies.

Multiple sample frequencies can be used with the same sampling latch, or with multiple sampling latches. If the same sampling latch is used, the phase detector output can be temporarily decoupled from the loop filter to observe the alias frequency produced by the sampling when operating at a second sampling frequency, and allows the observer to narrow down the possible operating frequencies. Alternatively, two sampling latches operated in parallel, but at different sampling frequencies can both sample the oscillator frequency and be used to narrow down the possible operating frequencies of the oscillator. It should be evident to a person skilled in the art that this principle can be readily extended in the same manner to more than two sampling frequencies as well, with the sample frequencies preferably chosen such that the sample frequencies have a large common multiple.

Regenerative Sampling Latch Considerations

The distinguishing component of the invention herein is the circuit that performs the subsampling operation in the feedback path. Analog sample-and-hold or ADC circuits work well for low frequency applications, but to sample high-frequency oscillator outputs, a sampling latch with binary outputs is more appropriate. The desired behavior for the sampling latch is like that of a D-latch or D-type flip-flop. Most of the D flip-flop circuits in existing literature, however, are designed for use as storage elements in digital circuits. These circuits are optimized for figures-of-merit such as the power-delay product or physical circuit size, but the design criteria for digital circuits are not necessarily applicable to our sampling latch. More relevant design criteria are imposed on high performance D-latch circuits found in retiming flip-flops for high-speed interfaces. Power consumption and latency for D-latches in retiming circuits are less of a concern.

The constraints placed on a regenerative subsampling latch in an embodiment of this invention are less demanding than standard latch or flip-flop designs used in frequency dividers, since the latch reset time and clock-to-output can be dozens of oscillator cycles. As a result, the decision time for the latch before it settles can be much longer than a single period of the oscillator. The only constraint is that the latch output is consistent from cycle to cycle of the sample signal and that the regenerative sampling latch output corresponds to the phase of the oscillator signal. A static design where the latch evaluation is dictated by the sampling rate has the benefit of reducing power consumption.

Figure 3:
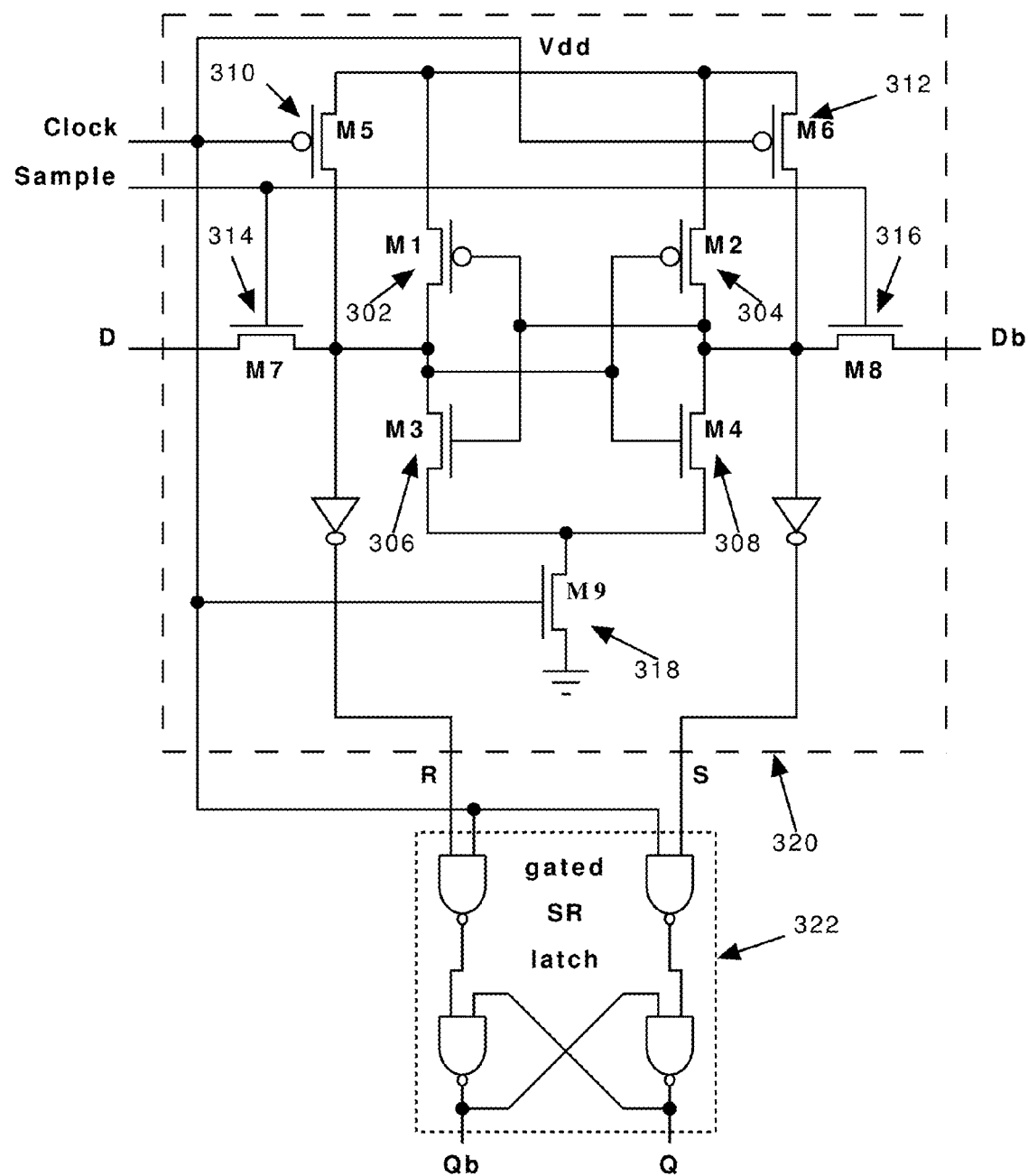
FIG. 3 is a circuit schematic of an embodiment of a regenerative sampling latch. The embodiment depicted in FIG. 3 is sometimes referred to as a differential pass-transistor pulsed latch.

A first embodiment of a regenerative sampling latch is shown in FIG. 3. Two cross coupled inverters, consisting of transistors 302, 304, 306 and 308, add the regenerative mechanism to the sampling latch. The first stage differential pass-transistor pulsed latch 320 uses a separate pulse generation circuit that is connected to the gate of pass transistors 314 and 316. When the clock signal connected to precharge transistors 310, 312 and enabling transistor 318 goes high, a brief pulse is generated on the sample signal connected to the gate on pass transistors 314 and 316 and causes the differential inputs D and Db connected at the source of transistors 314 and 316 to be coupled to internal nodes and activating the regenerative mechanism. For optimal performance the pulse generation circuit should be designed to minimize the pulse length while ensuring that the sampling circuit remains functional across process variations. A gated SR latch 322 at the output of the sampler holds the values when the internal nodes of the cross-coupled inverters, used for regenerative feedback, are precharged through 310 and 312 when the clock signal goes low.

Figure 4:
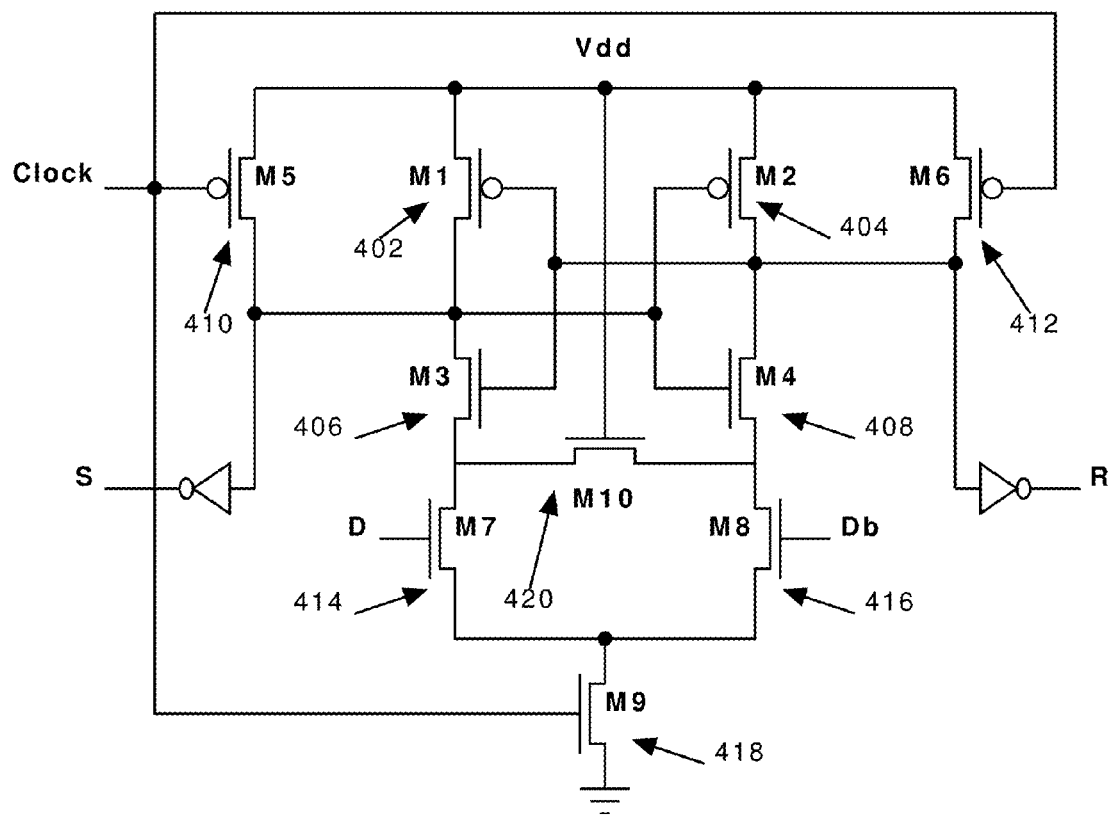
FIG. 4 is a circuit schematic of a second embodiment of a regenerative sampling latch. The second embodiment depicted in FIG. 4 is the first stage latch component of a classical sense-amplifier flip-flop.

A second embodiment of a regenerative sampling latch is shown in FIG. 4. The latch in FIG. 4 is based on a sense-amplifying flip-flop design. The circuit in FIG. 4 uses two cross-coupled NAND-like elements, consisting of transistors 402, 404, 406, 408, 414 and 416 to add the regenerative mechanism to the latch. The differential inputs D and Db connected to input transistors 414 and 416 are sampled when the clock signal connected to transistors 410, 412 and 418 goes high, amplifying the differential signal present on the circuit input ports. As in FIG. 3, a gated SR latch would be connected at the output to hold the values of the internal nodes when they are precharged through transistors 410 and 412.

Figure 5:
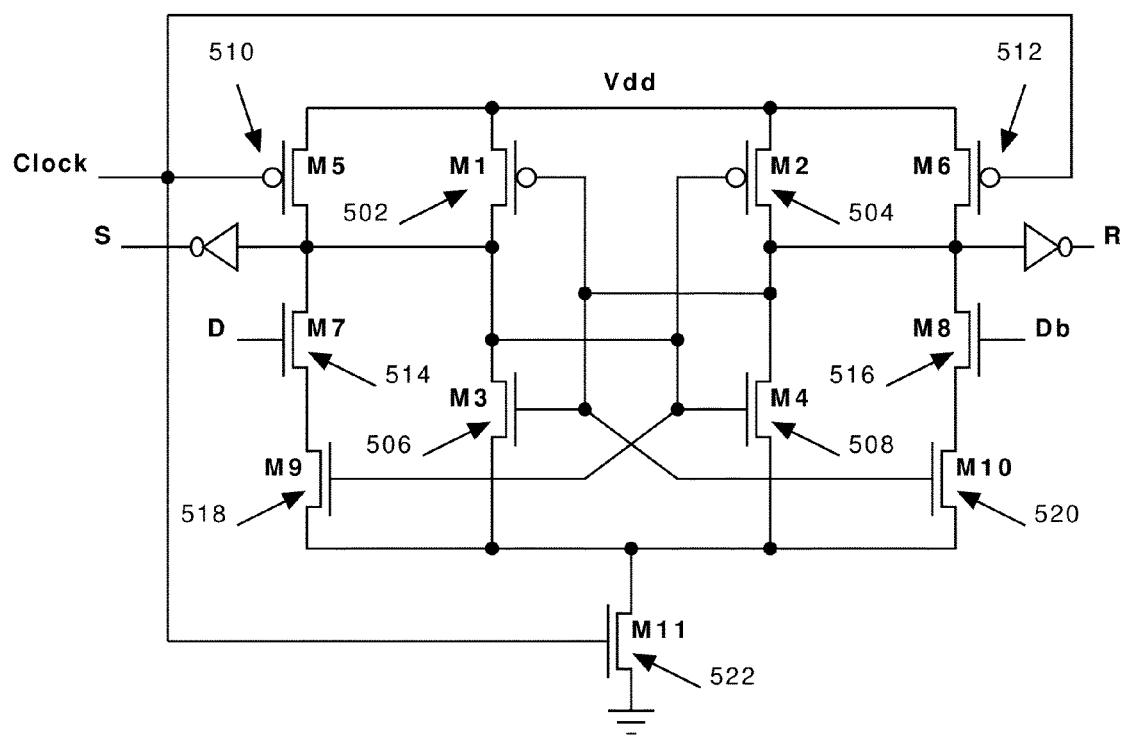
FIG. 5 is a circuit schematic of a third embodiment of a regenerative sampling latch.

A third embodiment of a regenerative sampling latch is depicted in FIG. 5. The edge-less sampling latch in FIG. 5 uses two cross-coupled inverter elements, consisting of transistors 502, 504, 506 and 508, to add the regenerative mechanism to the sampling latch. The differential inputs D and Db connected to the gate of transistors 514 and 516 are sampled when the clock signal, connected to precharge transistors 510, 512 and 522 goes high. When the regenerative mechanism has amplified the internal nodes to rail-to-rail voltages, the coupling of the internal nodes to transistors 518 and 520 prevents changes on the input differential signals D and Db from affecting the internal nodes any further. As in FIG. 3, a gated SR latch would be connected at the output to hold the values of the internal nodes when they are precharged through 510 and 512.

Duty Cycle Correction

One performance limiting problem in differential circuits designs often employed in high-speed sampling latches arises from mismatch or asymmetry in what should be a balanced circuit. Careful consideration of geometry choices and their impact on device matching during the layout of a circuit can aid in minimizing the effects of device and parasitic mismatch. As device geometries shrink, however, practically unavoidable random variations are becoming more pronounced. In an attempt to correct latch circuits with threshold or asymmetry problems, a feedback mechanism is disclosed that counteracts imbalances in a circuit and adjusts the switching threshold.

An embodiment of the detection mechanism that can be used to adjust sampling latch input thresholds relies on a deviation of the duty cycle of the sampling latch output. In a perfectly balanced sampling latch, the subsampling operation on the oscillator signal should result in a square wave output signal with a duty cycle close to 50%. Several methods for duty cycle measurement have been reported, using analog, digital, or mixed digital/analog approaches. Most of the methods for measuring the duty cycle in previously published work, however, rely on complex circuits that are needed for systems where the frequency of the duty-cycle signal being measured is on the same order or higher than the clock frequency used to operate the measuring circuit. When measuring the duty cycle of the latch output signal, however, the sampling clock can be used as the system clock, because the frequency of latch output signal is lower than the system (sampling) clock. This greatly simplifies measuring the duty cycle, since the sample clock can then be used to sample the output values of the aliasing units.

Figure 6:
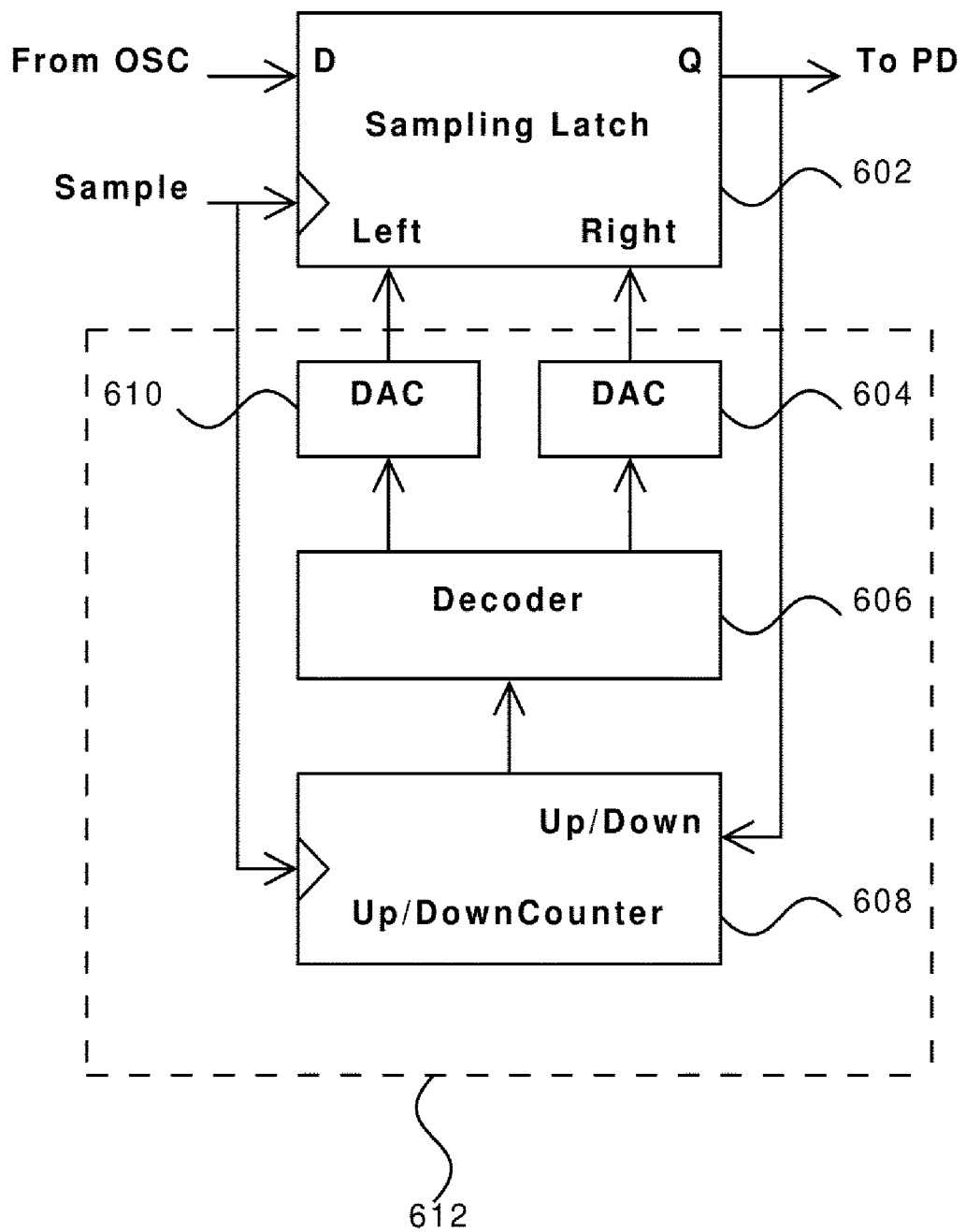
FIG. 6 is a block diagram of an embodiment of an input threshold correction method. The threshold correction is performed by measurement of the duty cycle of the regenerative sampling latch output signal.

One embodiment of a duty-cycle detection method is depicted in FIG. 6. The duty cycle measurement system 612 depicted uses a single up/down counter 608 that stores count values in two's complement. The up/down mode input of the counter 608 is evaluated on the rising edge of the sample clock signal that is clocks the sampling latch 602 and up/down counter 608. This up/down mode input determines whether the counter increments or decrements for the given sample clock period. The up/down mode for the counter 608 is driven directly by the sampling latch 602 output Q, so while the sampling latch 608 output is low, the count value in the counter 608 will decrement by one each sample clock period, and conversely, increment the count value of the counter 608 by one when the sampling latch 602 output is high. When operated in this manner, the up/down counter 608 generates a running sum of output values for the latch. For an ideal 50% duty cycle of the sampling latch 602 output Q, the long term average value stored in the counter 608 will tend to zero. Deviations from the ideal duty cycle will lead to an increasing or decreasing value in the counter 608, with the rate of change of the counter value dependent on the degree of deviation from a 50% duty cycle. The value stored in the up/down counter is then converted by a decoder 606 and programs the digital-to-analog (DAC) circuits 604 and 610 that control transistors within the sampling latch 602 that counter-act asymmetries and correct the duty cycle of the sampling latch output.

The bit-width of the counter and the DAC precision in such embodiments will depend on a number of factors. The DAC should have sufficient resolution that the balancing transistors can be controlled finely enough to correct the duty cycle. For different latch topologies, the required precision will differ, and is dependent on the sensitivity of the latch to changes in balancing transistor input. The total bit-width of the counter will depend on the required precision of the DAC and the ratio between the period of the sampling latch output signal and the period of the sampling clock. Once the DAC precision has been determined, the next factor that determines the bit-width of the counter is the fact that the low-order bits in the counter change continuously as the counter up/down mode input alternates from up to down during a single period of the sampling latch output. The value of these low-order bits during a single clock period should have no effect on the DAC output voltage. For instance, if the sampling clock has a period of 1 ns and the alias clock period is 32 ns with a 50% duty cycle, the up/down counter may increment by as much as 16 before decrementing by 16. Clearly, in this example, at a minimum, the 4 least-significant bits in the counter should be ignored by the DAC. In general, the more low order bits are ignored by the DAC, the more sample clock periods are required before the DAC output value is affected, and the slower the response of the duty cycle detection system and consequent adjustment of the input switching threshold level.

Figure 7:
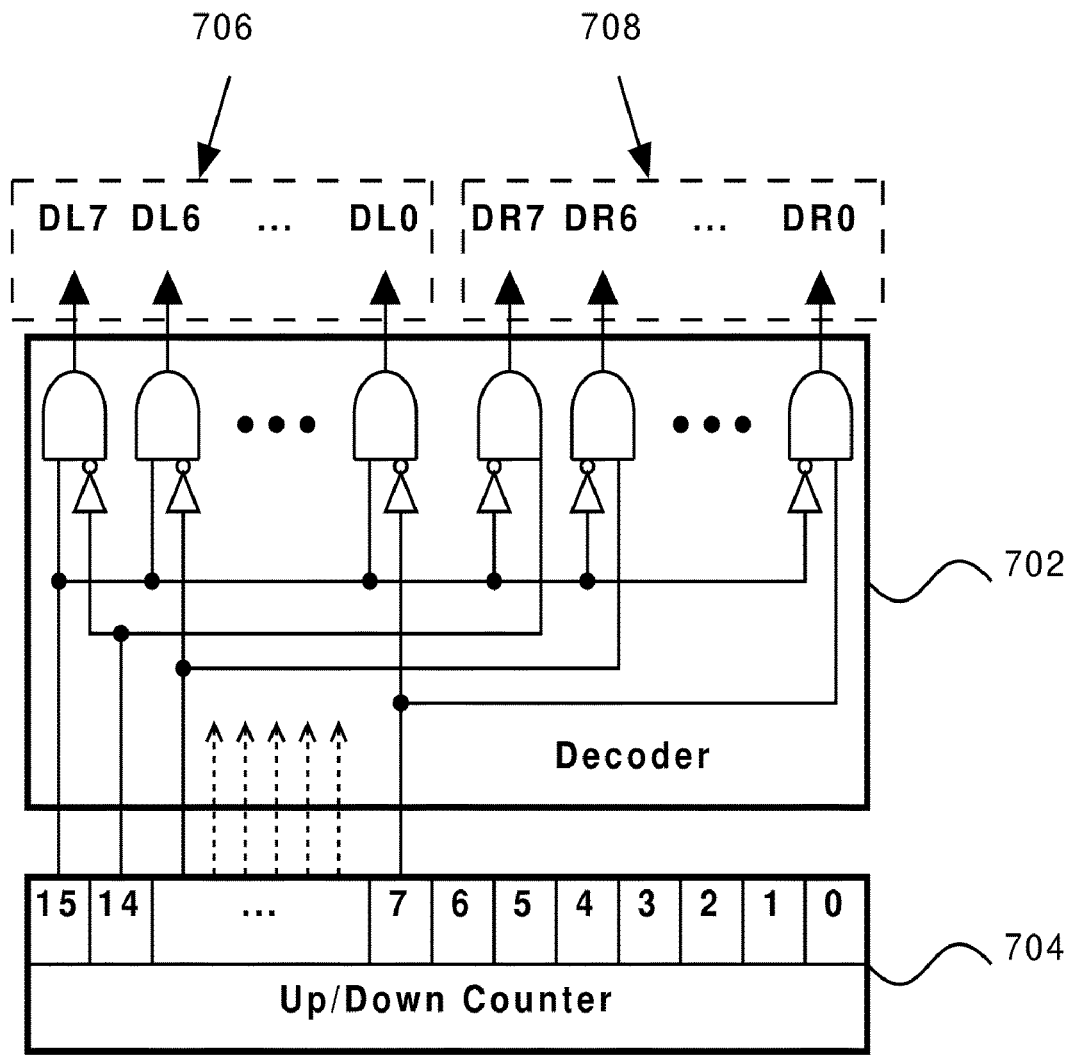
FIG. 7 is a block diagram of an embodiment showing details of the up/down counter and decoder within a duty cycle measurement circuit.

Another consideration for the duty cycle detection counter is the total required bit-width of the counter to avoid overflow of the counter. As the counter value changes and begins to alter the duty cycle of the latch, the sampling latch output duty cycle will approach 50%. As a 50% duty cycle is approached, the rate at which the counter will change decreases. When a 50% duty cycle has been reached, the control bits for the DAC should not change at all. The implication is that if the counter is saturated and the DAC control values have saturated but the counter value is still changing, the duty cycle is not correctable by the system, and an eventual overflow of the counter is unavoidable, independent of the bit-width of the counter. An embodiment of the counter and decoder is shown in FIG. 7, revealing the logic internal to the decoder 702 and further showing the up/down counter 704 and the output connection of the bits that store the count value in two's complement format. Thus bit 15 of the up/down counter 704, the most significant bit (MSB), is used by the decoder 702 to determine whether the duty cycle of the latch output is below 50% (MSB is low) or above 50% (MSB is high). When the MSB is high the next 8-bits (bits 14 through 7) stored in the counter 704 are complemented and activate the left DAC control outputs 706 (DL7 through DL0) while the right DAC control outputs 708 will remain low. When the MSB is low, the right DAC is activated with the count value in bits 14 through 7 of the counter 704, while the left DAC control outputs 706 are low.

The system depicted in FIG. 6 creates a feedback system that continually adjusts the voltage on the balance transistors in the differential latch circuit so that the duty cycle is exactly 50%. However, as with any feedback system, this system may be unstable or oscillate. Because the adjustment steps are discrete, oscillations in the duty cycle will occur. An improved embodiment of the duty-cycle detection and correction system would only adjust the latch if the duty cycle deviation exceeded a specified value. For example, a duty cycle that ranges between 45 and 55% may be acceptable. In order to achieve a duty cycle detection mechanism that only causes corrections outside a programmed range, a certain number of low order bits in the counter can be reset periodically by a second counter. In a specific embodiment of this method, the lower five bits are reset to a known value every 300 cycles of the sampling clock. The known value loaded into the counter depends on the MSB of the up/down counter. If the MSB is high (1), and the counter value is thus negative, the lower five bits are reset to a two's complement value representation of −1 (11110 for a reset of the lower five bits).

If the MSB is low (0), the lower five bits are set to 1 (00001 for a reset of the lower five bits). Using 300 cycles for a five bit reset implies that the up/down count increment or decrement during the 300 cycle period must exceed 31 to affect the counter output value. To exceed the 5 bit reset range, the difference between count of high (highcount) and count of low (lowcount) values sampled during this cycle must exceed 31. Assuming a duty cycle that is above 50%, highcount must exceed lowcount by at least 31. The sum of lowcount and highcount is always 300, and thus highcount need be at a minimum be 166, leaving lowcount at 134. With a 300 cycle reset period this corresponds to a duty cycle of 166/300, or 55.3%. Thus when the duty cycle is greater than 55.3% the lower counter bits are reset, but the more significant bits that control the threshold adjustment are not reset, and any changes to those bits are kept. Similarly, if the duty cycle is less than 44.7%, the threshold adjustment value gets changed despite the periodic reset. Some care must be taken to ensure that the low-order bit reset period is not a multiple of the predicted period of the output latch signal. If these periods are harmonically related, unfortunate low-order bit reset timing can cause the counter to count faster than intended. This risk can be minimized by ensuring that the number of low-order bits reset is sufficiently large that changes in the count value require multiple periods of the latch circuit.

Figure 8:
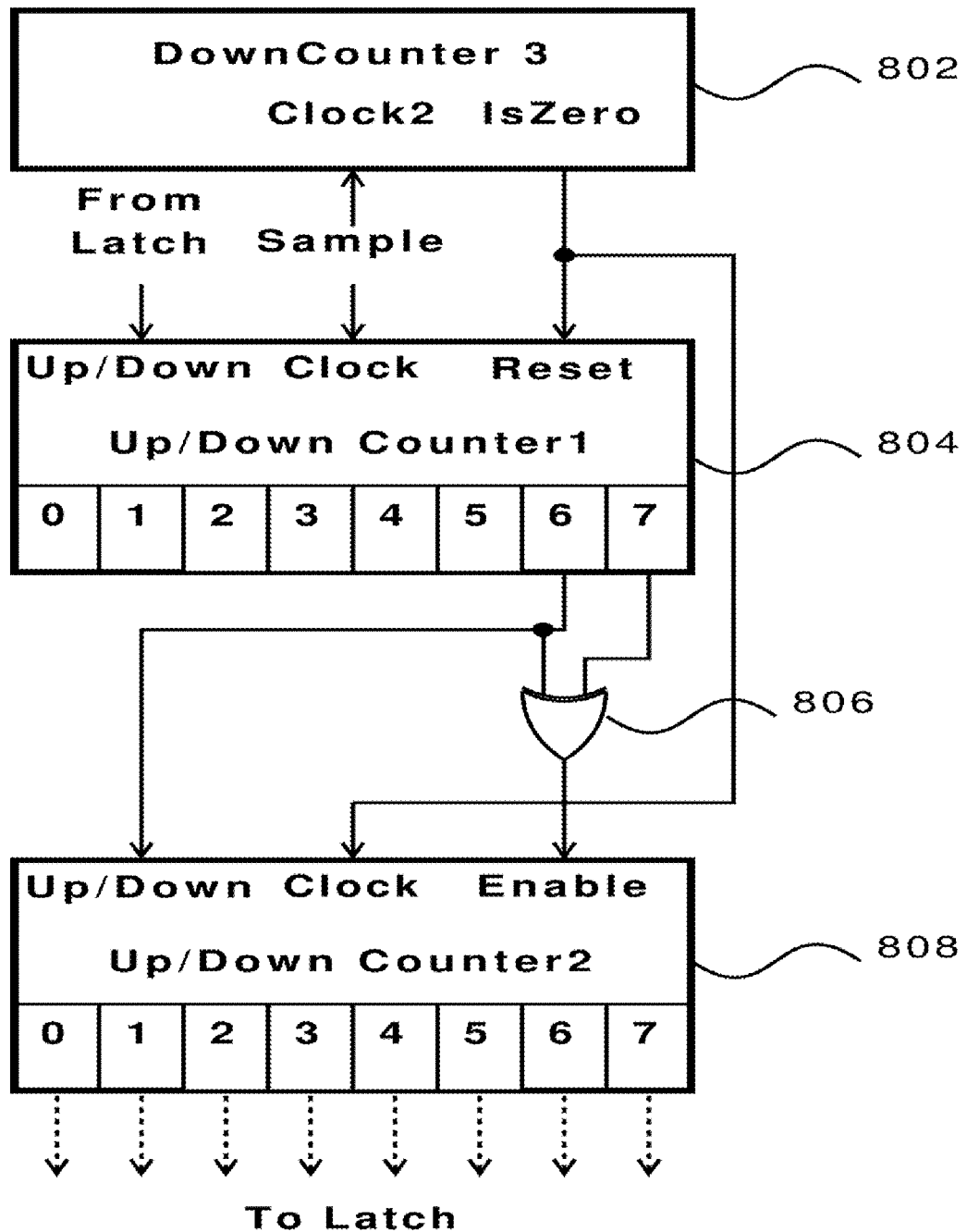
FIG. 8 is a block diagram of an embodiment of a duty cycle measurement circuit using two up/down counters for duty cycle detection. The depicted duty cycle measurement circuit only changes its output when the duty cycle exceeds a specified range.

Another embodiment of a duty cycle detection mechanism that only adjusts thresholds when the duty cycle exceeds a specified range is shown in FIG. 8. Rather than using a single up/down counter where the low order bits are reset, two up/down counters can be used instead in the dual up/down counter method. The first up/down counter 804 is still connected to the latch output and driven by the sample clock and counts in two's complement, but does not directly adjust the latch circuit. The second up/down counter 808 is connected to the first up/down counter, and only increments when the MSB of the first up/down counter is 0, and the next most-significant bit is 1, i.e. only when the first up/down counter 804 has counted to a large negative number. Similarly, the second counter 808 only decrements when the MSB of the first counter is 0 and the next most-significant bit is 1, i.e. the first up/down counter 804 has counted to a large negative number. The second up/down counter 808 is clocked by a third countdown counter 802. When the third counter 802 reaches zero, it resets the first up/down counter 804, and may cause the second up/down counter 808 to increment or decrement, according to the two most-significant bits in the first up/down counter 804. The determination whether to enable the increment or decrement on the second counter 808 is made by the XOR logic element 806. The third counter 802 should have a count down value large enough to ensure that the first up/down counter 804 does not overflow. The output of the second up/down counter 808 can then connected to a decoder that controls the threshold adjustment circuit in the latch, for instance through the method described in the single up/down counter method associated with FIG. 6.

If the output of the sampling circuit contains noise or sporadic transitions then these will cause problems with the phase detector. As a result of such noise or sporadic transitions the output signal from the phase detector may be erroneous. These problems can be mitigated by digitally filtering the output of the sampling latch to ignore sampled values that are of the minority value. One such filter is a median filter, using samples from sliding windows or non-overlapping windows.

Observations

As will be apparent to those skilled in the art, various modifications, combinations and adaptations of the specific embodiment, method and examples herein are possible without departing from the present invention. The invention should therefore not be limited by the above described embodiment, method, and examples, but by all embodiments and methods within the scope and spirit of the invention as claimed.

What is claimed is:

1. A frequency synthesizer, comprising:
   (a) a phase detector having as inputs a reference frequency signal and a feedback signal, the phase detector being operable to generate a phase detection signal based on a comparison of phases between the reference frequency signal and the feedback signal;
   (b) a loop filter coupled to the phase detector for receiving the phase detection signal, generating a loop filter output signal;
   (c) an oscillator with frequency controlled by the loop filter output signal, generating an oscillator signal;
   (d) and a feedback circuit coupled to the oscillator signal for generating the feedback signal, the feedback circuit comprising a regenerative sampling latch circuit, the regenerative sampling latch circuit clocked by a sampling frequency that is less than the frequency of the oscillator signal to generate a regenerative sampling latch circuit output signal, wherein the feedback signal is derived from the regenerative sampling latch circuit output signal.

2. The frequency synthesizer of claim 1, wherein the feedback circuit, in addition to the first regenerative sampling latch, further comprises a second regenerative sampling latch circuit, the second regenerative sampling latch circuit operated with a sampling frequency less than the frequency of the oscillator and different from the sampling frequency of the first regenerative sampling latch.

3. The frequency synthesizer of claim 1, wherein the phase detector can be decoupled from the loop filter thereby allowing the regenerative sampling latch being operable at other sampling frequencies to uniquely determine the operating frequency of the voltage controlled oscillator through monitoring of the regenerative sampling latch circuit output signal.

4. A method for adjusting the threshold of a latch circuit, which comprises
   (a) a latch circuit with an adjustable switching threshold;
   (b) an observer unit having as an input the latch circuit output and generating an observer signal that represents the ratio of low logic values to high logic values at the latch output;
   (c) an adjusting circuit having as an input the observer signal produced and generating a latch adjustment signal that adjusts the switching threshold of the latch.

5. A threshold correction circuit for latch circuits, comprising
   (a) a latch circuit having as inputs a signal or signals for data input, an enable input and having a plurality of adjustment inputs controlling the threshold of the latch circuit, and having as outputs a data signal which represents the value of input signals when the enable input is asserted, and maintaining current value when the enable input is not asserted, where the output value is further controlled by the adjustment inputs to modify the threshold applied to the input data signals
   (b) an up/down counter having as inputs a clock signal and a mode signal and having a plurality of output signals representing the count value, where the mode signal is sampled by the clock signal and where the mode signal is coupled to the differential latch data output signal and where the mode signal value determines whether the counter value is incremented or decremented (c) a decoding unit that is coupled to the up/down counter output signal for generating digital-to-analog converter control signals (d) a digital-to-analog converter coupled to decoding unit for generating control voltages for adjustment of individual transistors in the differential latch circuit.

6. The threshold cycle correction circuit of claim 5, wherein the up/down counter comprises an additional full reset input, which when asserted, brings the count value stored in the up/down counter to a known state.

7. The threshold correction circuit of claim 5, wherein the up/down counter comprises an additional partial reset input, which when asserted, brings the count value in a specified number of low-order bits to a known state.

8. The threshold correction circuit of claim 7, wherein the partial reset input is coupled to a programmable secondary counter, enforcing a periodic reset of the low-order bits of the up/down counter when the secondary counter reaches a programmable count value and resets, thereby providing a mechanism that adjusts the threshold only when the ratio of logic high to logic low values at the latch output exceeds a specific range, specified through the programmable counter reset value.

9. A method of controlling an oscillator using a reduced-frequency alias signal produced by the digital binary sub-sampling of the oscillator output signal.

10. The method of claim 9 where the digital sub-sampling employs positive feedback.

11. The method of claim 9 where the reduced alias frequency signal is used to control the phase of an oscillator.

12. The method of claim 9 where the reduced frequency alias signal is used to control the frequency of an oscillator.

13. The method of claim 9 where the reduced frequency alias signal is further digitally filtered to reduce sporadic transitions.

14. The method of claim 9 where the reduced frequency alias signal is further digitally filtered to reduce transitions caused by noise.

15. The method of claim 9 where the reduced frequency alias signal is further median filtered to reduce transitions.

16. The frequency synthesizer of claim 1, wherein the sampling latch circuit output signal is coupled to a divider, the output of which is the feedback signal.

\* \* \* \* \*